United States Patent
Kimura et al.

(10) Patent No.: US 9,666,629 B2
(45) Date of Patent: May 30, 2017

(54) METHOD OF MANUFACTURING ELECTRONIC DEVICE AND METHOD OF MANUFACTURING PHOTOELECTRIC CONVERSION DEVICE

(71) Applicant: CANON KABUSHIKI KAISHA, Tokyo (JP)

(72) Inventors: Tetsuya Kimura, Fuchu (JP); Koki Takami, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/054,617

(22) Filed: Feb. 26, 2016

(65) Prior Publication Data
US 2016/0268329 A1 Sep. 15, 2016

(30) Foreign Application Priority Data
Mar. 12, 2015 (JP) ................. 2015-049116

(51) Int. Cl.
*H01L 27/146* (2006.01)

(52) U.S. Cl.
CPC .. *H01L 27/14636* (2013.01); *H01L 27/14683* (2013.01)

(58) Field of Classification Search
CPC ......... H01L 27/14683; H01L 27/14636; H01L 31/0508; H01L 23/5226; H01L 23/528
See application file for complete search history.

(56) References Cited

U.S. PATENT DOCUMENTS

| | | | | |
|---|---|---|---|---|
| 5,773,196 A | * | 6/1998 | Shih | ............ G03F 7/09 |
| | | | | 257/E21.029 |
| 6,242,337 B1 | * | 6/2001 | Okada | .......... H01L 23/528 |
| | | | | 257/E23.151 |
| 6,723,647 B1 | * | 4/2004 | Kim | ............ H01L 23/544 |
| | | | | 257/E21.645 |
| 2011/0143485 A1 | | 6/2011 | Tazoe | |

FOREIGN PATENT DOCUMENTS

| | | |
|---|---|---|
| JP | 11-045868 A | 2/1999 |
| JP | 2011-124454 A | 6/2011 |

\* cited by examiner

*Primary Examiner* — Yasser A Abdelaziez
(74) *Attorney, Agent, or Firm* — Fitzpatrick, Cella, Harper & Scinto

(57) ABSTRACT

Provided is a method of manufacturing an electronic device, including: forming a first electrode over a substrate forming a first insulating layer over the first electrode; forming a second electrode over the first insulating layer; forming a second insulating layer over the second electrode; and polishing a surface of the second insulating layer by CMP, in which an end portion of the second electrode that is closest to a rim of the substrate is formed at a location closer to the rim of the substrate than an end portion of the first electrode that is closest to the rim of the substrate is.

12 Claims, 7 Drawing Sheets

FIG. 1
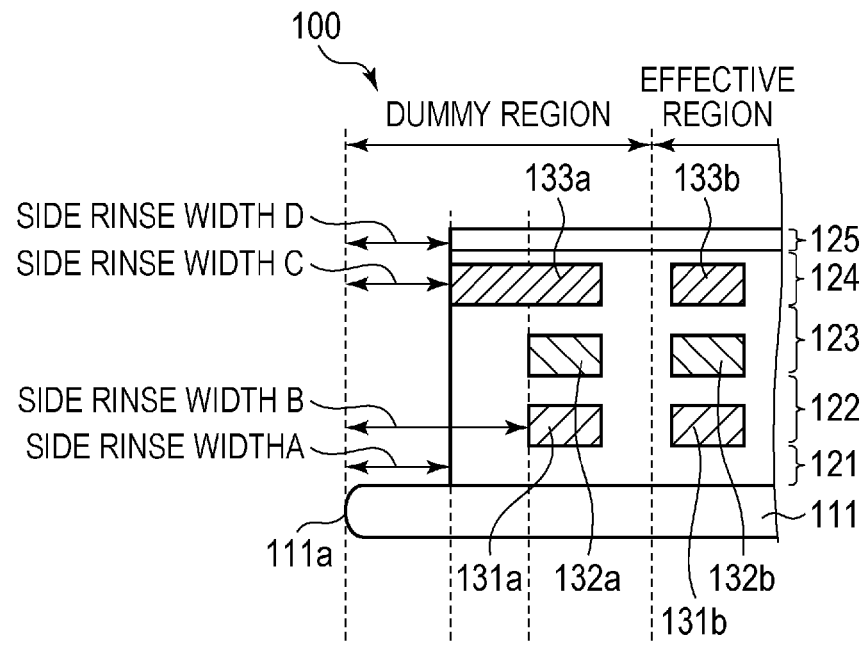
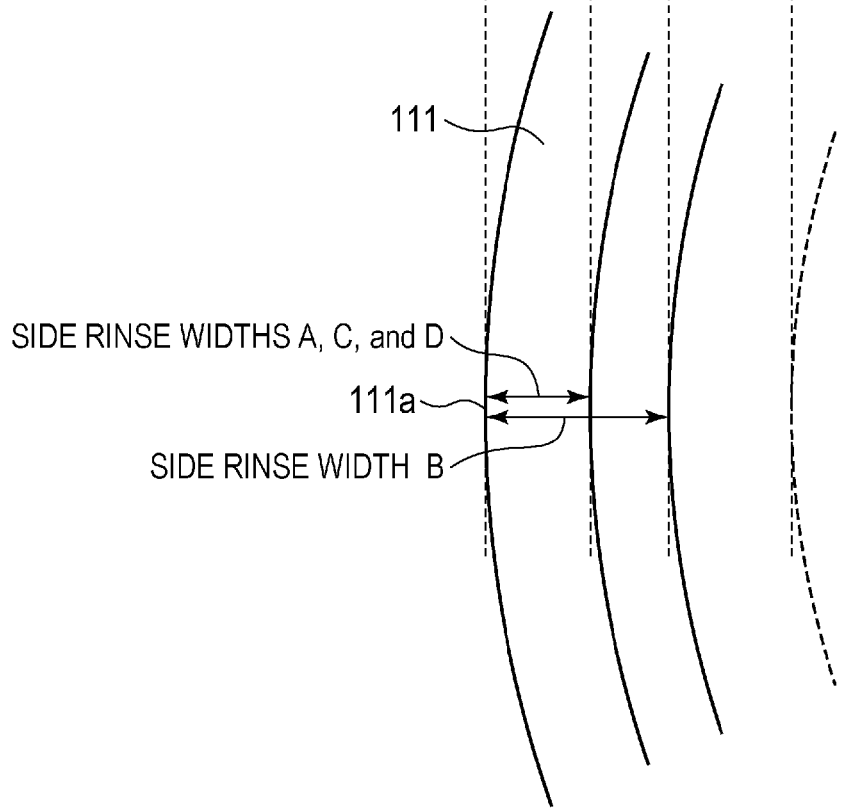

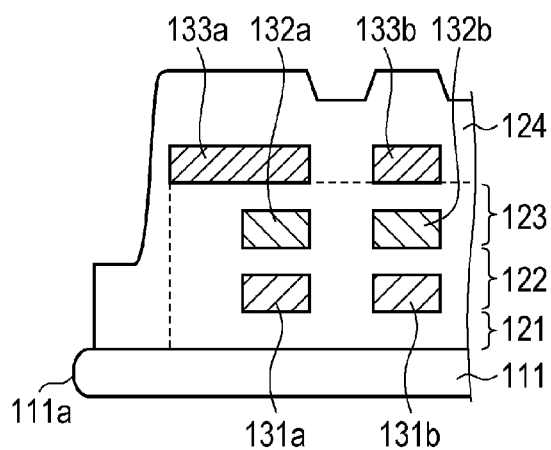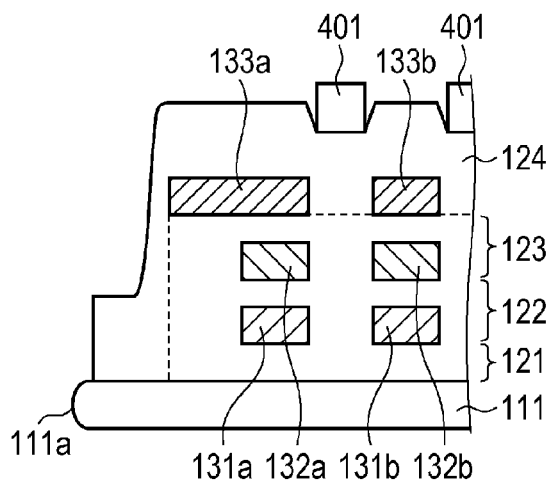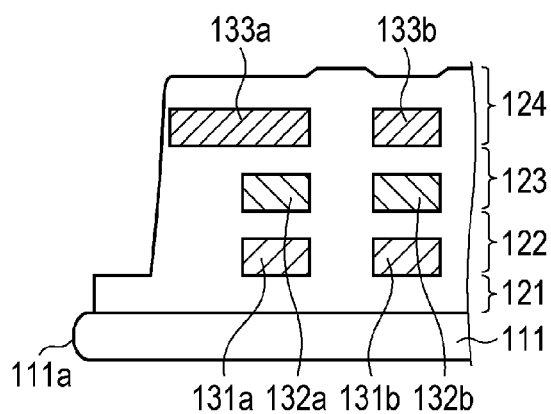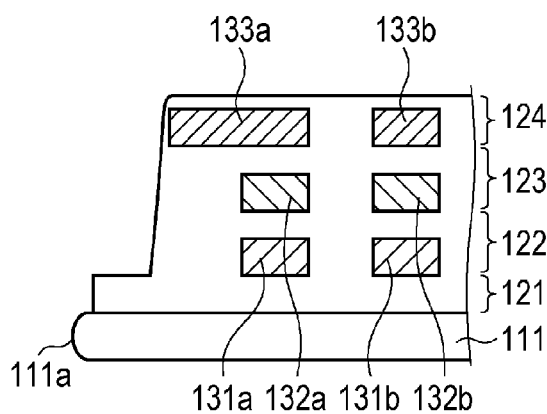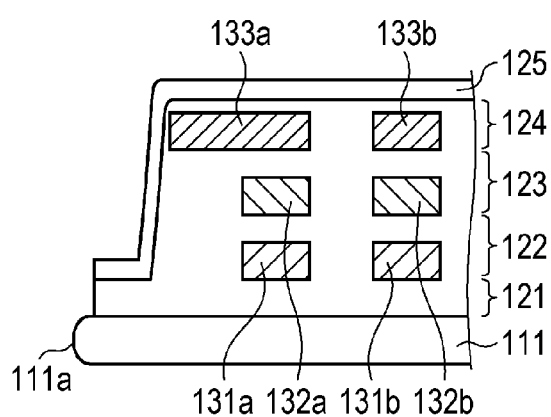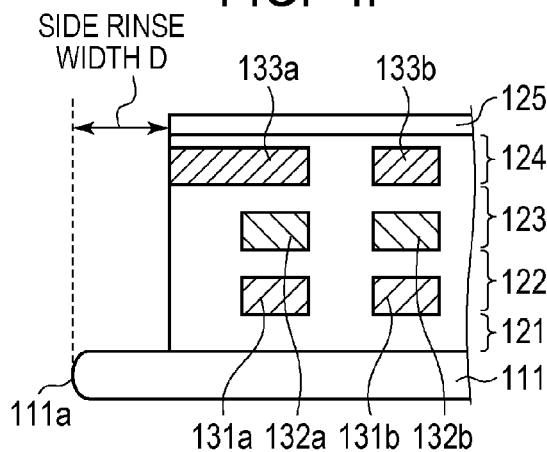

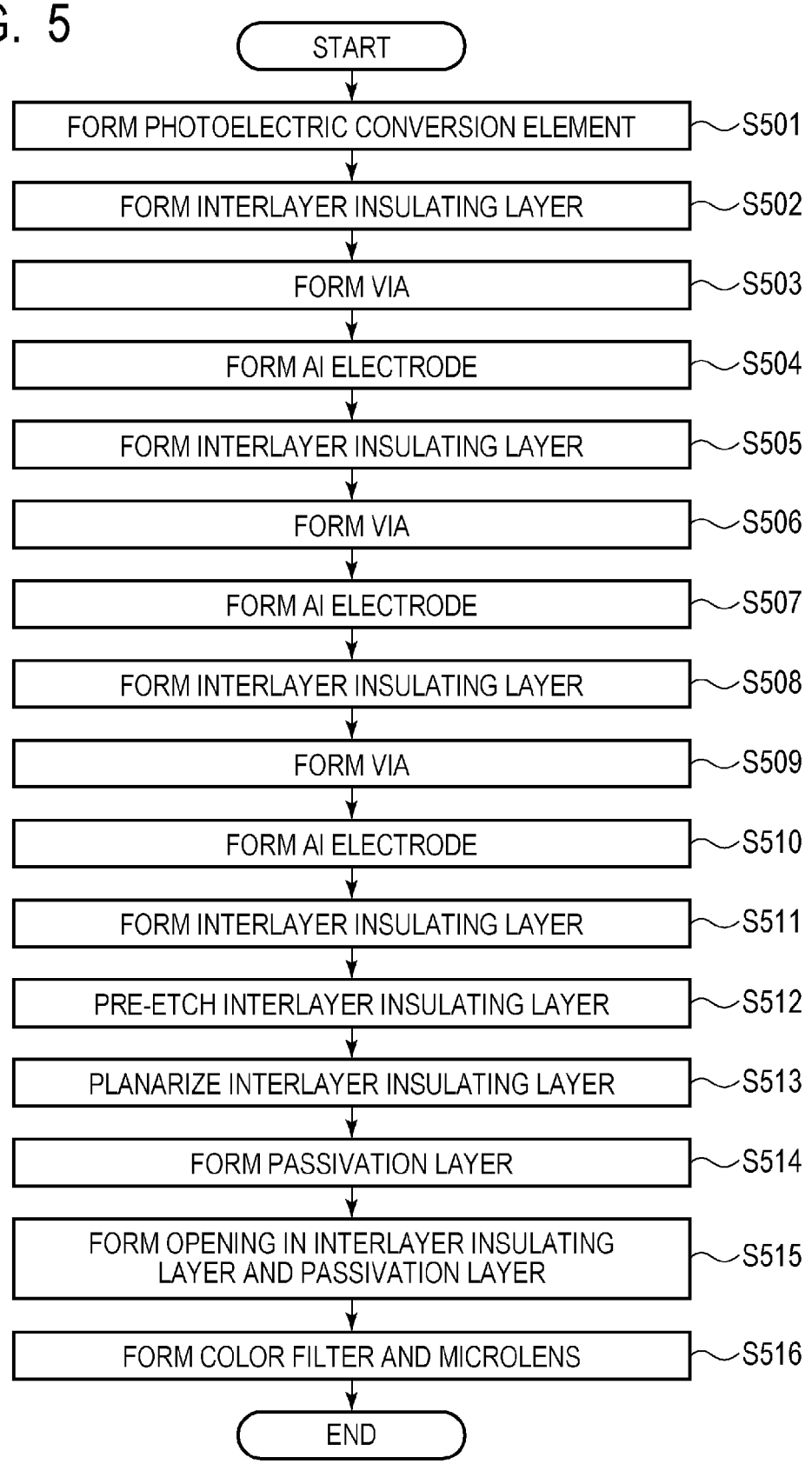

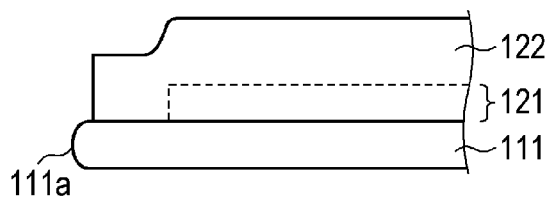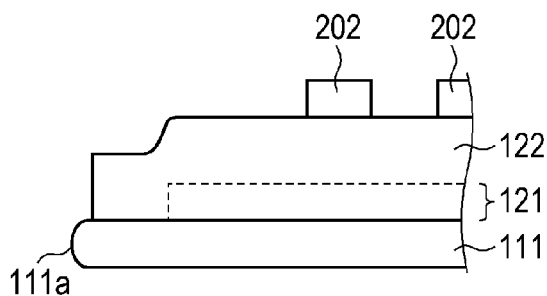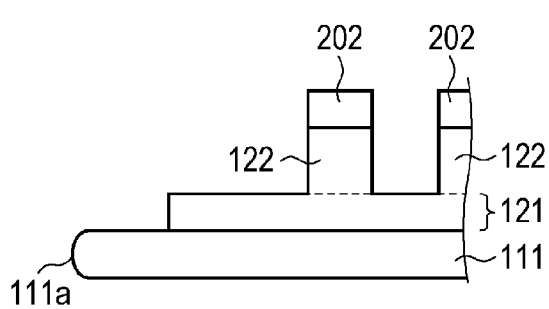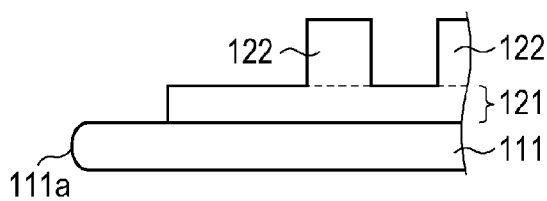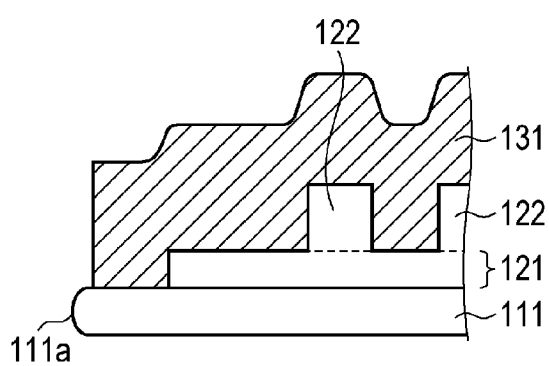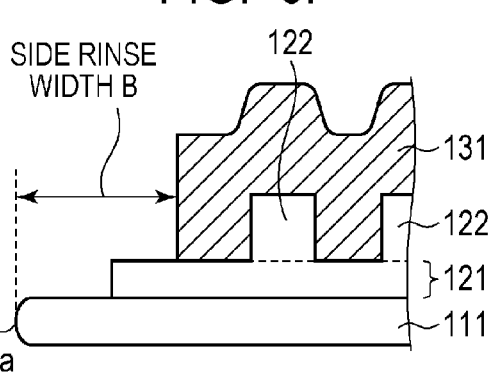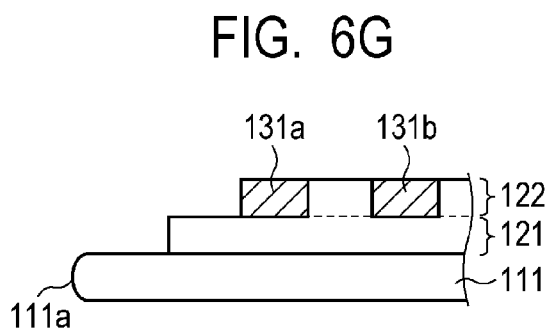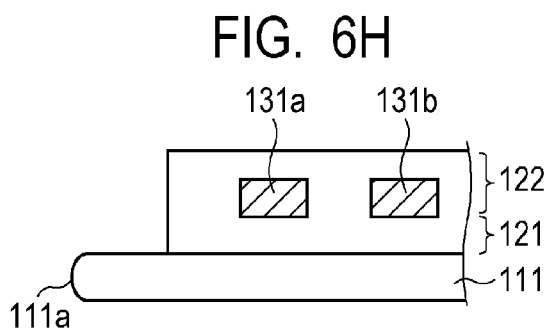

METHOD OF MANUFACTURING ELECTRONIC DEVICE AND METHOD OF MANUFACTURING PHOTOELECTRIC CONVERSION DEVICE

BACKGROUND OF THE INVENTION

Field of the Invention

The present invention relates to a method of manufacturing an electronic device and a method of manufacturing a photoelectric conversion device.

Description of the Related Art

In Japanese Patent Application Laid-Open No. 2011-124454, there is described a method of manufacturing a solid-state image pickup device. The solid-state image pickup device includes an image pickup region in which a photodiode and the like are formed, and a peripheral circuit region in which a scanning circuit and the like are formed. There may be a difference in density (area of a wiring pattern formed per unit area) between a wiring pattern formed in the image pickup region and a wiring pattern formed in the peripheral circuit region. In a solid-state image pickup device, the density is often higher in the peripheral circuit region than in the image pickup region. When an insulating layer is formed on such a wiring pattern and a level difference caused at that time is reduced by planarization using chemical mechanical polishing (CMP), the image pickup region has a film thickness distribution therein. A difference in optical path length due to the film thickness distribution may cause color unevenness.

Therefore, in the manufacturing method described in Japanese Patent Application Laid-Open No. 2011-124454, part of the insulating layer in the peripheral circuit region is etched out, and after that, a surface of the insulating layer is planarized by CMP. In Japanese Patent Application Laid-Open No. 2011-124454, there is a description that this can reduce variations in film thickness after the planarization of the surface of the insulating layer between the image pickup region and the peripheral circuit regions, to thereby uniformize optical characteristics.

When the surface of the insulating layer is planarized by CMP as in the manufacturing method described in Japanese Patent Application Laid-Open No. 2011-124454, there are cases in which not only the insulating layer but also an electrode forming the wiring pattern is shaved away. The shaved electrode may cause a poor connection in wire bonding process or of variations in wiring resistance.

SUMMARY OF THE INVENTION

According to one embodiment of the present invention, there is provided a method of manufacturing an electronic device, including: forming a first electrode over a substrate; forming a first insulating layer over the first electrode; forming a second electrode over the first insulating layer; forming a second insulating layer over the second electrode; and polishing a surface of the second insulating layer by CMP, in which an end portion of the second electrode that is closest to a rim of the substrate is formed at a location closer to the rim of the substrate than an end portion of the first electrode that is closest to the rim of the substrate is.

According to another embodiment of the present invention, there is provided a method of manufacturing a photoelectric conversion device, including: preparing a substrate having a photoelectric conversion element formed thereon; forming a first electrode over the substrate; forming a first insulating layer over the first electrode; forming a second electrode over the first insulating layer; forming a second insulating layer over the second electrode; and polishing a surface of the second insulating layer by CMP, in which an end portion of the second electrode that is closest to a rim of the substrate is formed at a location closer to the rim of the substrate than an end portion of the first electrode that is closest to the rim of the substrate is.

Further features of the present invention will become apparent from the following description of exemplary embodiments with reference to the attached drawings. According to at least one of the embodiments of the present invention, when the surface of the insulating layer is planarized by CMP, an electrode forming a wiring pattern can be less liable to be shaved away.

BRIEF DESCRIPTION OF THE DRAWINGS

FIG. 1 is an illustration of a method of manufacturing a photoelectric conversion device according to a first embodiment of the present invention, in which part (a) is a sectional view, and part (b) is a top view, for illustrating a structure around a substrate end portion.

FIGS. 4A, 4B, 4C, 4D, 4E and 4F are sectional views for illustrating the method of manufacturing a photoelectric conversion device according to the first embodiment.

FIG. 5 is a process flow chart of the method of manufacturing a photoelectric conversion device according to the first embodiment.

FIGS. 6A, 6B, 6C, 6D, 6E, 6F, 6G and 6H are sectional views for illustrating a method of manufacturing a photoelectric conversion device according to a second embodiment of the present invention.

DESCRIPTION OF THE EMBODIMENTS

Figure 2A:
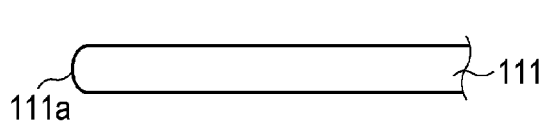
FIGS. 2A, 2B, 2C, 2D, 2E, 2F, 2G and 2H are sectional views for illustrating the method of manufacturing a photoelectric conversion device according to the first embodiment.

Preferred embodiments of the present invention will now be described in detail in accordance with the accompanying drawings.

First Embodiment

A first embodiment of the present invention relates to a manufacturing method for forming, on a substrate, an electronic device having a multilayer wiring structure, and more particularly, to a method of manufacturing a photoelectric conversion device configured to output an electric signal depending on an amount of incident light. A photoelectric conversion device 100 manufactured according to this embodiment can be applied to a wide range of uses such as a use for a solid-state image pickup device used in a digital camera, a scanner, or the like, and a use for a focus detection device used in a single-lens reflex camera. First, a method of manufacturing a photoelectric conversion device according to the first embodiment of the present invention is described with reference to FIG. 1, FIG. 2A to FIG. 2H, FIG. 3A to FIG. 3F, FIG. 4A to FIG. 4F, and FIG. 5.

First, a structure of a photoelectric conversion device manufactured by the manufacturing method according to this embodiment is described with reference to part (a) and part (b) of FIG. 1. Part (a) and part (b) of FIG. 1 are a sectional view and a plan view, respectively, for illustrating a structure around a substrate end portion in the method of manufacturing a photoelectric conversion device according to the first embodiment. Part (a) of FIG. 1 is a sectional view for illustrating a portion around the substrate end portion in which the photoelectric conversion device 100 is formed. The photoelectric conversion device 100 includes a substrate 111 and a multilayer wiring structure formed on the substrate 111. The multilayer wiring structure includes three layers of electrodes 131a, 131b, 132a, 132b, 133a, and 133b, and five insulating layers 121, 122, 123, 124, and 125.

The substrate 111 includes an image pickup region in which a photodiode and an element separation region are arranged, and a peripheral circuit region in which a scanning circuit, an amplifier, and the like are arranged.

A plurality of photoelectric conversion devices 100 are formed on the substrate 111 so as to be two-dimensionally arranged at predetermined intervals. By cutting the substrate into pieces by dicing or the like after a process before cutting the substrate into pieces is completed, a large number of chips of the photoelectric conversion devices 100 are manufactured at the same time.

Due to factors such as specifications of a manufacturing apparatus, it is difficult to manufacture the photoelectric conversion devices 100 with stability up to the vicinity of a rim 111a of the substrate 111. Therefore, a predetermined range from the rim 111a of the substrate 111 (for example, a range of 3 mm from the rim 111a) is a dummy region in which manufacture of a non-defective photoelectric conversion device 100 is not aimed at. Note that, similarly to the remaining region, the dummy region has a pattern of the photoelectric conversion device 100 itself formed therein as well. The region inside the dummy region is an effective region for manufacturing the photoelectric conversion device 100.

The five insulating layers 121, 122, 123, 124, and 125 are formed in the stated order on the substrate 111. The electrodes 131a and 131b (first electrodes) are formed on the insulating layer 121. The insulating layer 122 (first insulating layer) is formed on the insulating layer 121 so that the electrodes 131a and 131b are embedded therein. The electrodes 132a and 132b (first electrodes) are formed on the insulating layer 122. The insulating layer 123 (first insulating layer) is formed on the insulating layer 122 so that the electrodes 132a and 132b are embedded therein. The electrodes 133a and 133b (second electrodes) are formed on the insulating layer 123. The insulating layer 124 (second insulating layer) is formed on the insulating layer 123 so that the electrodes 133a and 133b are embedded therein. The insulating layer 125 is formed on the insulating layer 124. Vias (not shown) embedded in the insulating layer 121 are formed between the substrate 111 and the electrodes 131a and 131b, respectively, for electrical connection. Similarly, vias (not shown) are formed in the insulating layers 122, 123, 124, and 125, respectively. A state in which an insulating layer is formed so that an electrode is embedded therein is also hereinafter described as the insulating layer being formed on the electrode.

The electrodes 131a, 132a, and 133a are electrodes formed in the dummy region. The electrodes 131b, 132b, and 133b are electrodes formed in the effective region, and, after the photoelectric conversion device 100 is completed, function as wiring layers for exchanging signals between the image pickup region and the peripheral circuit region. The insulating layers 121, 122, 123, and 124 are interlayer insulating layers formed between the substrate 111 and the electrode 131b, between the electrodes 131b and 132b, and between the electrodes 132b and 133b, and on the electrode 133b, respectively. The insulating layer 125 is a passivation layer.

FIG. 2A to FIG. 2H, FIG. 3A to FIG. 3F, and FIG. 4A to FIG. 4F are sectional views for illustrating the method of manufacturing a photoelectric conversion device according to the first embodiment. FIG. 5 is a process flow chart of the method of manufacturing a photoelectric conversion device according to the first embodiment. A method of forming the electrodes 131a, 131b, 132a, 132b, 133a, and 133b and the insulating layers 121, 122, 123, 124, and 125 is described with reference to FIG. 2A to FIG. 2H, FIG. 3A to FIG. 3F, FIG. 4A to FIG. 4F, and FIG. 5.

In Step S501, photoelectric conversion elements are formed on the substrate 111. FIG. 2A is a sectional view for illustrating the substrate 111. The substrate 111 is a silicon substrate substantially in the shape of a disc (having a diameter of, for example, 200 mm). The substrate 111 has the photodiode and the element separation region formed thereon. Further, a plurality of transistors for converting charge generated by the photodiode into a voltage signal through photoelectric conversion and reading the voltage signal are formed on the substrate 111. A control electrode (not shown) containing polysilicon or the like as a main component thereof is formed on the substrate 111 for the purpose of controlling the transistors. In this way, the substrate 111 having the photoelectric conversion elements formed thereon is prepared.

In Step S502, the insulating layer 121 is formed on the substrate 111. Step S502 includes depositing the insulating layer 121, forming a resist 201 on the insulating layer 121, and etching the insulating layer 121. Note that, in the following description, the resist is a photoresist that is a photosensitive material, but the present invention is not limited thereto, and the resist may be any material that can be used as an etching mask.

Figure 2B:
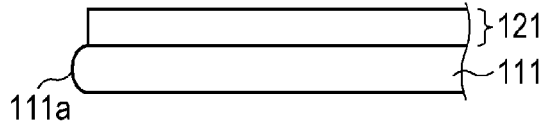

FIG. 2B is a sectional view after the insulating layer 121 is deposited on the substrate 111. The insulating layer 121 contains, as a main component thereof, silicon oxide that is deposited by chemical vapor deposition (CVD). It is more preferred that the insulating layer 121 be formed of borophosphosilicate glass (BPSG) that is silicon oxide having boron and phosphorus added thereto. An interlayer insulating layer using BPSG can be planarized in a heating process at about 800° C. (reflowing), and thus, is effective in reducing unevenness that may be caused by the control electrode for the transistors, an element separation structure, or the like. In this way, a planar underlayer for forming electrodes on the insulating layer is provided.

Figure 2C:
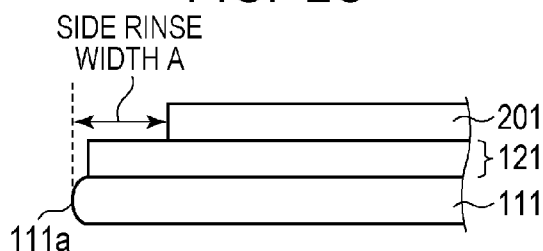

FIG. 2C is a sectional view after the resist 201 as an etching mask is formed on the insulating layer 121. The resist 201 is formed on the insulating layer 121 in a predetermined pattern through coating of the resist 201 using a coating apparatus, exposure using an exposure apparatus such as a stepper, and then, development using a development apparatus.

In this step, processing is performed so that the resist 201 may not be formed in a range of a predetermined side rinse width A from the rim 111a of the substrate 111. The side rinse width A is set to be, for example, 0.8 mm. The processing is performed in a side rinse step of, for example, exposing only the vicinity of the rim 111a of the substrate 111 to an organic solvent when the resist 201 is coated, to thereby remove the resist 201 attached to the vicinity of the rim 111a of the substrate 111. As another way, a peripheral exposure step may also be adopted in which, through exposure of a range of a predetermined distance from the rim 111a of the substrate 111 after the coating of the resist 201, the resist 201 is removed from the vicinity of the rim 111a of the substrate 111 after the development. In this case, the resist 201 is of a positive type.

In the description below, removing the resist in the vicinity of the rim 111a in the side rinse step is adopted, but the peripheral exposure step may be similarly adopted. For example, in the description below, by reading the term "side rinse width" as "range of peripheral exposure", a configuration of this embodiment may be applied when the peripheral exposure step is employed to the fabrication process.

Figure 2D:
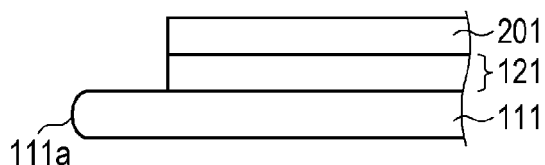

FIG. 2D is a sectional view after the insulating layer 121 is etched. After the resist 201 is formed, the insulating layer 121 is etched by reactive ion etching (RIE) or the like with the resist 201 being used as a mask. This forms a pattern of contact holes for forming the vias and the like in the insulating layer 121. Further, at the same time, the range of the predetermined side rinse width A from the rim 111a of the substrate 111 lacks the resist 201 in the side rinse step described above, and thus, a portion of the insulating layer 121 corresponding to this range is etched out. After that, the resist 201 is removed by cleaning with an organic solvent or the like.

In Step S503, the vias (not shown) for continuity between the substrate 111 and the electrode 131b are formed. The vias are formed in a step of depositing a metal film containing tungsten as a main component thereof by sputtering, CVD, or the like and embedding the metal in the contact holes formed in the insulating layer 121. An unnecessary portion of the metal film that is deposited on the portion other than the contact hole is removed thereafter by CMP.

In Step S504, the electrodes 131a and 131b are formed. Step S504 includes depositing the electrode 131, forming a resist 202 on the electrode 131, and etching the electrode 131.

Figure 2E:
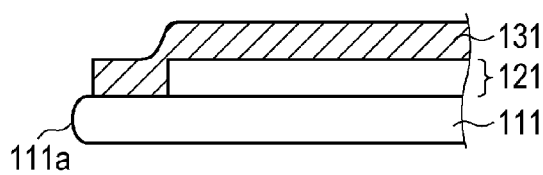

FIG. 2E is a sectional view after the electrode 131 is deposited on the insulating layer 121. The electrode 131 contains aluminum as a main component thereof, and is deposited by sputtering or the like.

Figure 2F:
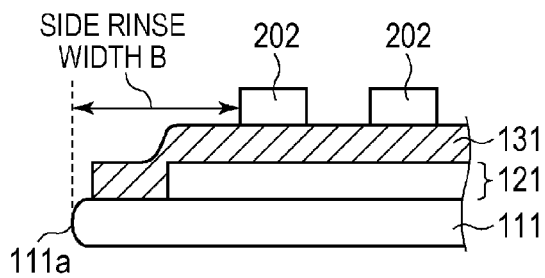

FIG. 2F is a sectional view after the resist 202 serving as an etching mask is formed on the electrode 131. The resist 202 is formed by a step similar to that when the insulating layer 121 is formed, which is described above. A side rinse width B when the resist 202 is formed is set to be larger than the side rinse width A when the resist 201 is formed. The side rinse width B is set to be, for example, 1.9 mm.

Figure 2G:
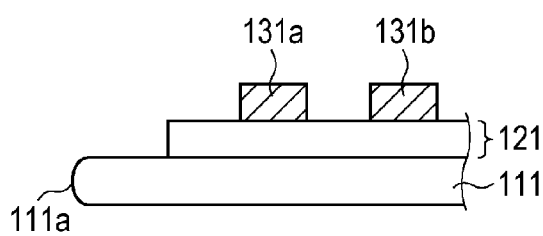

After that, the electrode 131 is etched by RIE or the like with the resist 202 being used as a mask. After the etching, the resist 202 is removed with an organic solvent or the like. FIG. 2G is a sectional view after the resist 202 is removed. Because of the difference in side rinse width when the resists are formed, an end portion of the outermost electrode 131a is located inside an end portion of the insulating layer 121 on the substrate 111. Note that, the term "end portion" of the electrode 131a, the insulating layer 121, or the like herein means an end portion on a side closer to the rim 111a of the substrate 111.

In Step S505, the insulating layer 122 is formed on the insulating layer 121 and the electrodes 131a and 131b. Step S505 includes depositing the insulating layer 122, forming a resist 301 on the insulating layer 122, and etching the insulating layer 122.

Figure 2H:
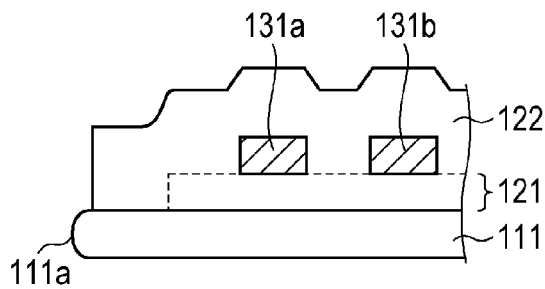

FIG. 2H is a sectional view after the insulating layer 122 is deposited on the insulating layer 121 and the electrodes 131a and 131b. It is preferred that the insulating layers deposited in this step and in subsequent steps be not BPSG but ordinary silicon oxide. The reason is that the electrodes 131a and 131b deteriorate by being heated, and thus, reflowing cannot be performed. Points other than this are similar to those of the formation of the insulating layer 121 described above.

Figure 3A:
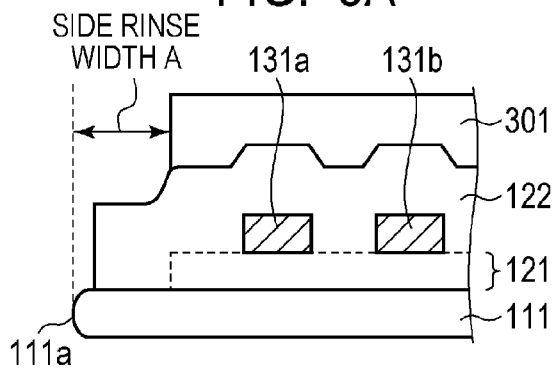
FIGS. 3A, 3B, 3C, 3D, 3E and 3F are sectional views for illustrating the method of manufacturing a photoelectric conversion device according to the first embodiment.

FIG. 3A is a sectional view after the resist 301 serving as an etching mask is formed on the insulating layer 122. The resist 301 is formed similarly to the resist 201. Specifically, a side rinse width when the resist 301 is formed in the side rinse step is the same as the side rinse width A when the resist 201 is formed. After that, similarly to the case of the insulating layer 121, the insulating layer 122 is etched and the resist 301 is removed.

Figure 3B:
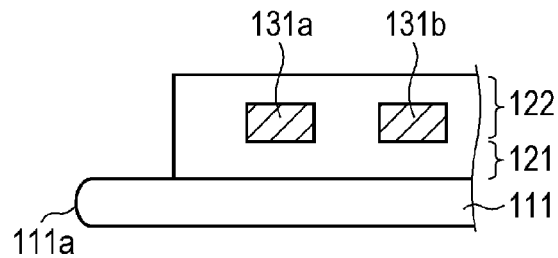

In Step S506, the vias (not shown) for continuity between the electrode 131b and the electrode 132b are formed. The step is similar to Step S503. FIG. 3B is a sectional view after the insulating layer 122 is formed.

Figure 3C:
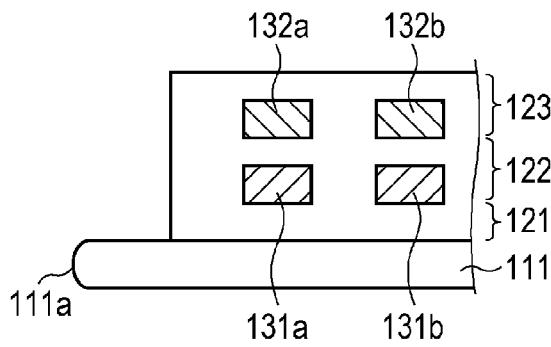

After that, in Steps S507, S508, and S509, the electrodes 132a and 132b and the insulating layer 123 are formed in similar ways. FIG. 3C is a sectional view after the electrodes 132a and 132b and the insulating layer 123 are formed. The electrodes 132a and 132b and the insulating layer 123 are formed in steps similar to those of forming the electrodes 131a and 131b and the insulating layer 122, respectively.

Figure 3D:
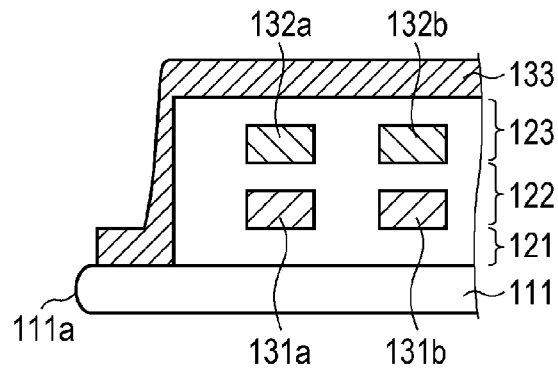

In Step S510, the electrodes 133a and 133b are formed similarly to the cases in which the electrodes 131a and 131b and the like are formed. FIG. 3D is a sectional view after the electrode 133 serving as an uppermost electrode in the multilayer wiring structure is deposited. This step is similar to the steps in which the electrodes 131 and 132 are formed.

Figure 3E:
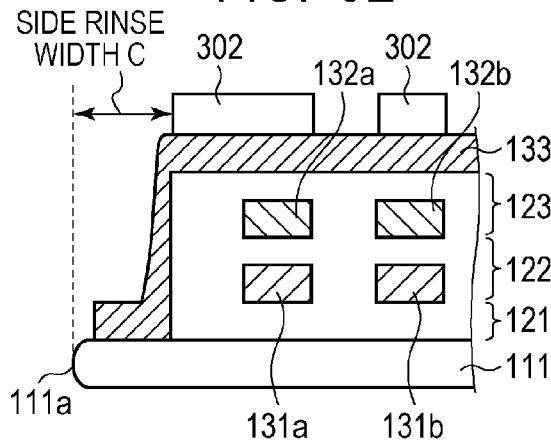

FIG. 3E is a sectional view after a resist 302 serving as an etching mask is formed on the electrode 133. A side rinse width C when the resist 302 is formed in the side rinse step is smaller than the side rinse width B when the resist 202 is formed. More specifically, the side rinse width C is equal to the side rinse width A.

Figure 3F:
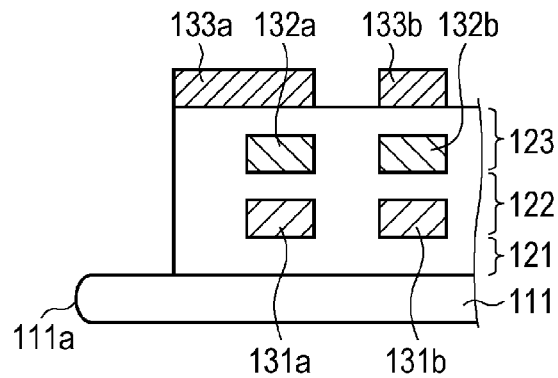
Figure 7:
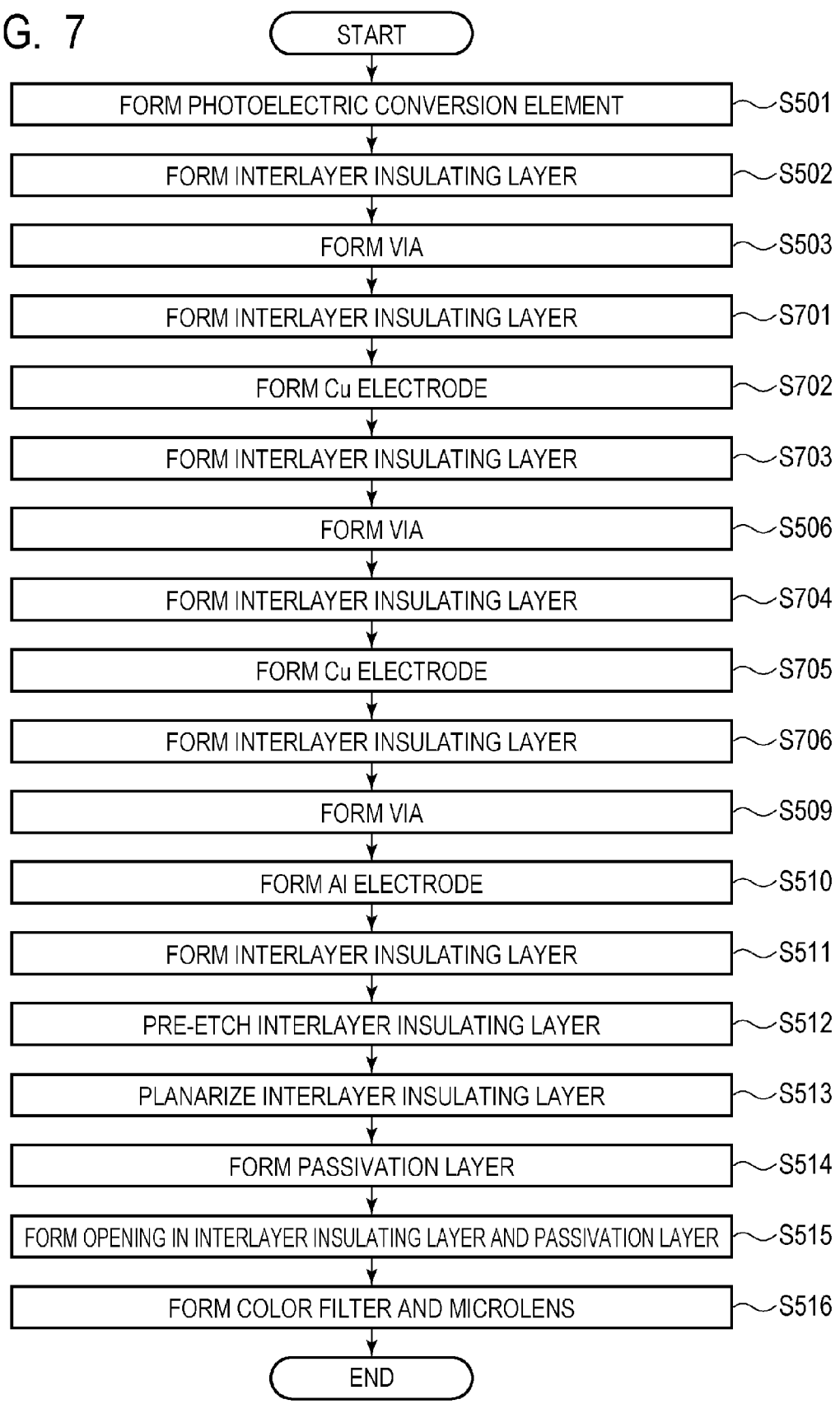
FIG. 7 is a process flow chart of the method of manufacturing a photoelectric conversion device according to the second embodiment.

After that, the electrode 133 is etched by RIE or the like with the resist 302 being used as a mask. After the etching, the resist 302 is removed with an organic solvent or the like. FIG. 3F is a sectional view after the resist 302 is removed. Because of the difference in side rinse width when the resists are formed, an end portion of the electrode 133a is located on the rim 111a side of the substrate 111 with respect to end portions of the electrodes 131a and 132a.

In Step S511, the insulating layer 124 is formed on the insulating layer 123 and the electrodes 133a and 133b. FIG. 4A is a sectional view after the insulating layer 124 is deposited on the insulating layer 123 and the electrodes 133a and 133b. As illustrated in FIG. 4A, portions in which the electrodes 133a and 133b are formed and portions in which no electrode is formed have different thicknesses, and thus, after the insulating layer 124 is deposited, unevenness is caused on a surface of the insulating layer 124. In order to reduce the unevenness, planarization of the surface by CMP is necessary. However, as described above, in the photoelectric conversion device 100, the density of electrodes is often higher in the peripheral circuit region than in the image pickup region. Therefore, if CMP is performed in this state, the polishing rate is uneven over the substrate surface due to a difference in film thickness between the peripheral circuit region and the image pickup region, and thus, the image pickup region may have a film thickness distribution therein.

In order to reduce the film thickness distribution, in Step S512, a pre-etching step is performed in which at least part of the surface of the insulating layer 124 is etched to reduce the film thickness. FIG. 4B is a sectional view after a resist 401 serving as a pre-etching mask is formed on the insulating layer 124. The resist 401 is formed on at least part of the surface of the insulating layer 124 so as to reduce the difference in film thickness due to presence/absence of an electrode. FIG. 4C is a sectional view after the insulating layer 124 is etched to remove the resist 401. The pre-etching step reduces the unevenness of the surface of the insulating layer 124.

In Step S513, the surface of the insulating layer 124 is planarized by CMP. FIG. 4D is a sectional view after the surface of the insulating layer 124 is planarized. By reducing the difference in film thickness before the CMP step, the film thickness distribution in the image pickup region that may be caused after the subsequent CMP step is reduced.

In Step S514, the insulating layer 125 that functions as a passivation layer is formed on the insulating layer 124. FIG. 4E is a sectional view after the insulating layer 125 is formed. The insulating layer 125 is a film containing silicon nitride or silicon oxynitride as a main component thereof, and is formed by CVD or the like.

In Step S515, openings are formed in the insulating layer 124 and the insulating layer 125. FIG. 4F is a sectional view after the insulating layers 124 and 125 are etched. The openings (not shown) are formed by etching in the insulating layer 124 and the insulating layer 125 for continuity to the electrodes 133a and 133b. Formation of a resist and the like are similar to those described above, and thus, description thereof is omitted. A side rinse width D when the resist is formed is set to be smaller than the side rinse width B. It is more suitable that the side rinse width D be equal to the side rinse width A and the side rinse width C.

After that, in Step S516, a color filter, a microlens, and the like (not shown) are formed on the insulating layer 125 to complete the photoelectric conversion device 100.

Referring back to part (a) and part (b) of FIG. 1, the setting of the side rinse widths A to D is described. As described above, locations of the end portions of the electrodes and of the insulating layers after being etched within the dummy region in the vicinity of the rim 111a of the substrate 111 depend on the side rinse widths when the resists are formed. Specifically, the locations of the end portions of the insulating layers 121, 122, and 123 depend on the side rinse width A, the locations of the end portions of the electrodes 131a and 132a depend on the side rinse width B, the location of the end portion of the electrode 133a depends on the side rinse width C, and the locations of the end portions of the insulating layers 124 and 125 depend on the side rinse width D.

The side rinse widths A, C, and D are set to be smaller than the side rinse width B. Specifically, the end portions of the insulating layers 121, 122, 123, 124, and 125 are formed so as to be closer to the rim 111a of the substrate 111 than the end portions of the electrodes 131a and 132a are. Further, the side rinse widths are set to be within the range of the dummy region. As an example, the side rinse widths A, C, and D are 0.8 mm, the side rinse width B is 1.9 mm, and the dummy region is a range of 3 mm from the rim 111a. Reasons that the side rinse widths A to D are set to be such values are described below.

First, a relationship among the side rinse widths A, B, and D is described. In a photolithography process, a portion of the substrate in the vicinity of the end portion thereof is liable to have a poor resolution. When an end portion of a metal electrode of, for example, aluminum is formed with a poor resolution, a defect due to separation of an electrode layer may be caused in a subsequent step. Therefore, it is preferred that the side rinse widths be set to be as large as possible so that the electrodes are not formed in the vicinity of the end portion in which the separation is liable to occur. On the other hand, when an element in the effective region is influenced by side rinsing, a pattern of effective elements is defectively formed, and thus, it is necessary that the side rinse widths be set so as to have a sufficient margin to prevent interference thereof in the effective region. From such a viewpoint, the side rinse width B is set to be 1.9 mm, with the margin being 1.1 mm when the dummy region is 3 mm.

On the other hand, it is preferred that the insulating layers be formed to points that are as close as possible to the end of the substrate so as to cover the electrodes. However, when the insulating layers are formed to the rim without side rinsing, a defect of an electrode remaining at the end portion may be caused in the step of forming the vias, and thus, side rinsing of a certain width is necessary. Therefore, the side rinse widths A and D are set to be 0.8 mm as a minimum side rinse width.

As described above, in a structure in which the electrodes and the insulating layers are stacked, it is preferred that the positional relationship among the end portions of the electrodes and of the insulating layers at the rim 111a of the substrate 111 be, in principle, that the end portions of the insulating layers are on an outer side (on the end side of the substrate).

However, the inventors of the present invention have found that, with regard to the electrode 133a, formation to the vicinity of the end of the substrate to an extent similar to that in the case of the insulating layers is exceptionally preferred. Specifically, according to this embodiment, the side rinse width C is set to be larger than the side rinse width B when the resist 202 is formed. Reasons are described below.

As described above, in order to reduce the level difference caused by the electrodes 133a and 133b, the insulating layer 124 is planarized by CMP. In the CMP, in the vicinity of the rim 111a of the substrate 111, polishing progresses not only from an upper surface but also from a side surface of the film, and thus, the polishing progresses more rapidly than in other portions. Therefore, there are cases in which, when the insulating layer 124 is polished, the insulating layer 124 is completely shaved away and the electrodes 133a and 133b are shaved away as well. The shaved electrode 133b arranged in the effective region can be a cause of poor connection in wire bonding process or of variations in wiring resistance, and can be a factor of reducing the yield of the photoelectric conversion device 100.

According to this embodiment, the side rinse width C is set to be smaller than the side rinse width B. This extends the end portion of the electrode 133a so as to be closer to the rim 111a of the substrate 111 than the end portions of the other electrodes are. Therefore, in an element in the dummy region in the vicinity of the rim 111a of the substrate 111, the electrode 133a extends farther to the outer side, and thus, a starting point of the polishing in the CMP step is farther to the outer side, which can increase the margin for the polishing from the side surface. This makes it easier to leave the insulating layer 124 on the electrode 133b arranged in the effective region, to thereby reduce the possibility of the electrode 133b being shaved away.

On the other hand, in the image pickup region, the electrodes 133a and 133b are used as, for example, a light shielding film, and thus, are wide wiring. In the peripheral circuit region, the electrodes 133a and 133b are used for, for example, a power supply circuit, and thus, are wide wiring as well. Therefore, both the electrodes 133a and 133b are wiring occupying a large area, and thus, separation thereof is relatively less liable to occur. Further, the electrodes 133a and 133b are in the uppermost layer of the plurality of electrode layers, and thus, the number of steps subsequent to the formation thereof is smaller than those of the other electrodes and the possibility of separation thereof is low. From the reasons described above, separation of the electrodes 133a and 133b in the uppermost layer is less liable to occur, and thus, with regard to the electrode 133a, formation to the vicinity of the end of the substrate to an extent similar to that in the case of the insulating layers is exceptionally preferred, and the side rinse width C is set to be 0.8 mm.

In the method of manufacturing the photoelectric conversion device 100 according to this embodiment, the side rinse width C when the electrodes 133a and 133b are formed is smaller than the side rinse width B when the electrodes 131a, 131b, 132a, and 132b are formed. This brings the end portion of the electrode 133a closer to the rim 111a of the substrate 111 than the end portions of the electrodes 131a and 132a are. By arranging the electrodes in this way, the margin for the polishing in the CMP step of the insulating layer 124 (second insulating layer) can be increased to reduce the possibility of the electrode 133b being shaved away. Therefore, the problem of poor connection in wire bonding process or of variations in wiring resistance is alleviated, and the photoelectric conversion device 100 can be manufactured with a high yield.

Second Embodiment

In a second embodiment of the present invention, copper wiring is used as the electrodes 131 and 132. In the first embodiment, the electrodes 131 and 132 are aluminum wiring, and are processed by etching that is RIE. On the other hand, when the electrodes 131 and 132 are copper wiring, it is difficult to dry etch copper by RIE, and thus, a damascene process is used in patterning copper. Therefore, according to this embodiment, the manufacturing method according to the first embodiment is partly changed in carrying out the present invention. A manufacturing method according to the second embodiment is described below with reference to FIG. 6A to FIG. 6H and FIG. 7, but description of points similar to those of the first embodiment is omitted or is made only in brief.

According to this embodiment, Step S501 to Step S503 described with reference to FIG. 2A to FIG. 2D and FIG. 5 are performed similarly to those in the first embodiment.

In Step S701, the insulating layer 122 is formed on the insulating layer 121. FIG. 6A is a sectional view after the insulating layer 122 is deposited on the insulating layer 121. The insulating layer 122 includes silicon oxide as a main component thereof. However, for the purpose of etching the insulating layer 122 to be described below, a stacked film including the silicon oxide layer and an etch stop layer (not shown) of silicon nitride or the like thereunder may also be used.

FIG. 6B is an illustration of a step of forming the resist 202 as an etching mask on the insulating layer 122. The resist 202 is formed in a pattern in which portions where electrodes are to be formed are open.

FIG. 6C is an illustration of a step of etching the insulating layer 122. After the resist 202 is formed, the insulating layer 122 is etched with the resist 202 being used as a mask by RIE or the like. FIG. 6D is a sectional view after the resist 202 is removed.

In Step S702, the electrode 131 containing copper as a main component thereof is formed on the insulating layer 121 and the insulating layer 122. FIG. 6E is a sectional view after the electrode 131 is formed on the insulating layers 121 and 122. As an example, the electrode 131 includes three layers that are a barrier layer, a seed layer, and a Cu electrode layer. First, the barrier layer (not shown) of titanium, titanium nitride, or the like is deposited by sputtering or the like. Then, the seed layer of copper is deposited by sputtering or the like. After that, copper is grown on the seed layer of copper by electroplating or the like. The electrode 131 formed in this way is formed so as to fill portions where the insulating layer 122 is etched out in the preceding step.

FIG. 6F is an illustration of a step of removing a portion of the electrode 131 formed in the vicinity of the rim 111a of the substrate 111. In this step, a portion of the substrate 111 other than the effective region is exposed to and wet etched with a solution of nitric acid, concentrated sulfuric acid, a sulfuric acid/hydrogen peroxide mixture, or the like. This removes an unnecessary portion of the electrode 131 that attaches to the vicinity of the rim 111a of the substrate 111. A distance from the rim 111a to an innermost end of the portion of copper to be removed is, similarly to the case of the first embodiment, the side rinse width B. Note that, unnecessary portions of copper attached to a side surface and a rear surface of the substrate 111 may be removed at the same time.

FIG. 6G is an illustration of a step of partly polishing the insulating layer 122 and the electrode 131 by CMP. This step patterns the electrodes 131a and 131b embedded in the insulating layer 122.

In Step S703, the insulating layer 122 is again formed on the electrode 131. In Step S506, the vias (not shown) are formed. FIG. 6H is a sectional view after the insulating layer 122 is formed on the electrode 131. These are substantially the same as Steps S505 and S506 described in the first embodiment with reference to FIG. 2H, FIG. 3A, and FIG. 3B.

After that, in Step S704 to Step S706, the electrodes 132a and 132b and the insulating layer 123 are formed by the damascene process similarly to the electrodes 131a and 131b and the insulating layer 122. The electrodes 133a and 133b in the uppermost layer and the insulating layers 124 and 125 are formed in an aluminum wiring process by etching that is similar to that of the first embodiment. In this case, similarly to the case of the first embodiment, the side rinse width C is smaller than the side rinse width B. In this way, an effect similar to that in the first embodiment is obtained.

As described above, according to this embodiment, even when the first and second wiring layers are formed by the damascene process, an effect similar to that in the first embodiment is obtained. In addition to this, in the photoelectric conversion device 100 according to this embodiment, the first and second layers are formed of copper wiring having a lower resistance than that of aluminum wiring, and thus, this embodiment is suitable when a miniaturized electronic device having a higher operation speed is required.

Note that, in the above description, a single damascene process in which the vias and the electrodes are not formed at the same time is described as an example, but the process flow may be modified as appropriate and a dual damascene process may be used.

Third Embodiment

In a third embodiment of the present invention, the step of pre-etching the insulating layer 124 (Step S512) in the first or second embodiment is omitted. Steps other than this are similar to those of the first or second embodiment. According to this embodiment, the step of pre-etching the insulating layer 124 is not performed, and thus, the difference in film thickness between the peripheral circuit region and the image pickup region is not reduced. Therefore, the film thickness distribution in the image pickup region increases. However, if performance requirements of the photoelectric conversion device 100 allow the film thickness distribution, the pre-etching step may be omitted.

As can be seen through comparison between FIG. 4A and FIG. 4C, the pre-etching step reduces a thickness of a portion of the insulating layer 124 attached to a side surface of the electrode 133a. When the pre-etching step is not performed, compared with the cases of the first and second embodiments, the portion of the insulating layer 124 attached to the side surface of the electrode 133a can be left thick. The portion of the insulating layer 124 attached to the side surface places the starting point of the polishing by the CMP step still farther to the outer side than that in the first embodiment, which can further increase the margin for the polishing from the side surface. This makes it easier to leave the insulating layer 124 on the electrode 133b arranged in the effective region to further reduce the possibility of the electrode 133b being shaved away compared with that in the first embodiment.

OTHER EMBODIMENTS

In the first to third embodiments described above, methods of manufacturing the photoelectric conversion device 100 are described as examples, but the present invention is also applicable to manufacture of electronic devices other than the photoelectric conversion device 100. In manufacturing electronic devices other than the photoelectric conversion device 100, similarly to the case of the photoelectric conversion device 100, when the surface of an insulating layer is planarized by CMP, an electrode forming a wiring pattern can be less liable to be shaved away. The present invention is particularly suitable for manufacture of an electronic device in which an insulating layer that covers an electrode in an uppermost layer of a multilayer wiring structure is required to be planarized by CMP.

In the first to third embodiments described above, the number of the layers of the electrodes is three, but there may be two layers or four or more layers, and the number of the layers may be increased or reduced as appropriate depending on the design.

When the surface of the insulating layer 124 is polished by CMP (Step S513) in the first to third embodiments described above, it is preferred that conditions of the polishing be set so that the insulating layer 124 may remain on the electrode 133a to prevent the electrode 133a from being polished. Further, even when the electrode 133a is polished, it is preferred that the amount thereof be small. In this case, it is preferred that the conditions be set so that the polishing rate of the electrode 133a by CMP may be smaller than the polishing rate of the insulating layer 124 by CMP. This allows the electrode 133a to function as a polish stop layer, and, even when the electrode 133a is partly polished, the amount thereof can be made as small as possible. The polishing rates by CMP can be set as appropriate through conditions of the CMP such as components of slurry used therein.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-049116, filed Mar. 12, 2015, which is hereby incorporated by reference herein in its entirety.

What is claimed is:

1. A method of manufacturing an electronic device, comprising:
   forming a first electrode over a substrate;
   forming a first insulating layer over the first electrode;
   forming a second electrode over the first insulating layer;
   forming a second insulating layer over the second electrode;
   reducing a film thickness of at least a part of a surface of the second insulating layer; and
   after the reducing, polishing the surface of the second insulating layer by chemical mechanical polishing,
   wherein a closest to a rim of the substrate end portion of the second electrode is formed at a location closer to the rim of the substrate than a location of a closest to the rim of the substrate end portion of the first electrode.

2. The method according to claim 1, wherein the forming of the second electrode over the first insulating layer comprises:
   depositing an electrode;
   forming a resist over the electrode, the resist being open at least in a range of a predetermined width from the rim of the substrate; and
   removing, by etching, a portion of the electrode corresponding to an opening of the resist, and
   wherein the location of the closest to the rim of the substrate end portion of the second electrode is determined by a width of the opening of the resist.

3. The method according to claim 1, wherein the polishing of the surface of the second insulating layer by the chemical mechanical polishing is performed so that the second insulating layer remains over the second electrode in an effective region that is a region other than a predetermined range from the rim of the substrate.

4. The method according to claim 1, wherein the second electrode comprises aluminum as a main component thereof.

5. The method according to claim 1, wherein the first electrode comprises copper as a main component thereof.

6. The method according to claim 1, wherein, in the polishing of the surface of the second insulating layer by the chemical mechanical polishing, a polishing rate of the second electrode by the chemical mechanical polishing is smaller than a polishing rate of the second insulating layer by the chemical mechanical polishing.

7. A method of manufacturing a photoelectric conversion device, comprising:
   preparing a substrate having a photoelectric conversion element formed thereon;
   forming a first electrode over the substrate;
   forming a first insulating layer over the first electrode;
   forming a second electrode over the first insulating layer;
   forming a second insulating layer over the second electrode;
   reducing a film thickness of at least a part of the surface of the second insulating layer; and after the reducing, polishing the surface of the second insulating layer by chemical mechanical polishing, wherein a closest to a rim of the substrate end portion of the second electrode is formed at a location closer to the rim of the substrate than a location of a closest to the rim of the substrate end portion of the first electrode.

8. The method according to claim 7, wherein the forming of the second electrode over the first insulating layer comprises:

depositing an electrode;

forming a resist over the electrode, the resist being open at least in a range of a predetermined width from the rim of the substrate; and removing, by etching, a portion of the electrode corresponding to an opening of the resist, and wherein the location of the closest to the rim of the substrate end portion of the second electrode is determined by a width of the opening of the resist.

9. The method according to claim 7, wherein the polishing of the surface of the second insulating layer by the chemical mechanical polishing is performed so that the second insulating layer remains over the second electrode in an effective region that is a region other than a predetermined range from the rim of the substrate.

10. The method according to claim 7, wherein the second electrode comprises aluminum as a main component thereof.

11. The method according to claim 7, wherein the first electrode comprises copper as a main component thereof.

12. The method according to claim 7, wherein, in the polishing of the surface of the second insulating layer by the chemical mechanical polishing, a polishing rate of the second electrode by the chemical mechanical polishing is smaller than a polishing rate of the second insulating layer by the chemical mechanical polishing.

* * * * *